United States Patent
Friedman et al.

(10) Patent No.: US 6,584,541 B2
(45) Date of Patent: Jun. 24, 2003

(54) METHOD FOR STORING DIGITAL INFORMATION IN WRITE-ONCE MEMORY ARRAY

(75) Inventors: David R. Friedman, Menlo Park, CA (US); Derek J. Bosch, Mountain View, CA (US); Christopher R. Moore, San Jose, CA (US); Joseph J. Tringali, Los Altos, CA (US); Michael A. Vyvoda, Fremont, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 210 days.

(21) Appl. No.: 09/727,229

(22) Filed: Nov. 30, 2000

(65) Prior Publication Data

US 2002/0065983 A1 May 30, 2002

Related U.S. Application Data

(63) Continuation-in-part of application No. 09/662,953, filed on Sep. 15, 2000, now abandoned.

(51) Int. Cl.⁷ .............................................. G06F 13/14
(52) U.S. Cl. ....................................................... 711/103
(58) Field of Search ........................................ 711/103

(56) References Cited

U.S. PATENT DOCUMENTS

| | | | |
|---|---|---|---|
| 4,646,266 A | 2/1987 | Ovshinsky et al. | 365/51 |
| 5,029,125 A | 7/1991 | Sciupac | 707/205 |
| 5,045,327 A * | 9/1991 | Tarlow et al. | 704/270 |
| 5,218,685 A | 6/1993 | Jones | 711/160 |
| 5,241,659 A | 8/1993 | Parulski et al. | 345/589 |
| 5,276,867 A | 1/1994 | Kenley et al. | 707/204 |
| 5,504,836 A * | 4/1996 | Loudermilk | 704/272 |
| 5,818,748 A | 10/1998 | Bertin et al. | 365/51 |
| 5,821,523 A * | 10/1998 | Bunte et al. | 235/472.01 |
| 5,826,235 A * | 10/1998 | Harman | 704/500 |
| 5,835,396 A | 11/1998 | Zhang | 365/51 |
| 5,878,292 A * | 3/1999 | Bell et al. | 396/312 |
| 6,034,882 A | 3/2000 | Johnson et al. | 365/103 |
| 6,208,545 B1 | 3/2001 | Leedy | 365/51 |
| 6,236,587 B1 | 5/2001 | Gudesen et al. | 365/105 |
| 6,249,316 B1 * | 6/2001 | Anderson | 348/333.05 |

* cited by examiner

*Primary Examiner*—David L. Robertson
(74) *Attorney, Agent, or Firm*—Brinks Hofer Gilson & Lione

(57) ABSTRACT

An acquisition/playback device and a memory device including a solid-state write-once memory array are used to acquire and display digital information such as digital images, voice, music, or the like. Prior to display or other presentation, the digital information is stored in a re-writable memory. After the digital information has been displayed or otherwise presented to the user for review, the user then elects whether to store the digital information in the write-once memory array. Depending upon the user election, the digital information is either stored in the write-once memory array, or erased from the re-writable memory without being stored in the write-once memory array. In this way the limited storage capacity of the write-once memory array is preserved for digital information that is of long-term interest to the user. Similarly, an acquisition/playback device itself can review the digital information stored in the re-writable memory and determine whether to commit that file to the write-once memory or to discard the file from the re-writable memory.

4 Claims, 2 Drawing Sheets

METHOD FOR STORING DIGITAL INFORMATION IN WRITE-ONCE MEMORY ARRAY

This application is a continuation-in-part of U.S. patent application Ser. No. 09/662,953, filed Sep. 15, 2000 (now abandoned).

BACKGROUND

The present invention relates to write-once memory devices, and in particular to methods for efficiently using such devices, particularly in conjunction with the storage of digital files such as voice, music or image files.

Write-once memory devices have the advantage that they can be made relatively inexpensively, but each memory location in the memory device can only be written once. For this reason, there is a need to use the available capacity of a write-once memory device efficiently.

Jones U.S. Pat. No. 5,218,685 discloses a system that combines a magnetic cache storage with optical disk storage. When a write command is executed, the associated file is written into the re-writable magnetic cache. If necessary, the oldest file in the magnetic cache is moved to optical disk to clear space for the new file.

Sciupac U.S. Pat. No. 5,029,125 describes a method for reading and writing files on non-erasable storage media. The disclosed system uses a re-writable cache to store a file allocation table. Only after the operating system finishes updating the cache memory, and the data in the cache is ready for writing, does the driver update the non-erasable storage media.

A need presently exists for improved methods for using write-once memory efficiently, especially for systems that store digital media files in write-once memory in response to consumer actions.

SUMMARY

By way of introduction, the preferred method described below is performed with an acquisition/playback device that is coupled with a solid-state, write-once memory device. The acquisition/playback device acquires digital information, which may correspond to voice, music, image, video or any other digital information. This digital information is initially stored as a digital file in a re-writable memory, and the stored digital file is then presented to the user for review with the acquisition/playback device. Depending upon whether the user wishes to store or discard the digital file, either the stored digital file is stored in the write-once memory device, or alternatively the stored digital file is cleared from the re-writable digital memory without storing it in the write-once memory device.

In this way, the user can review the digital file, and files that are discarded after this review are never stored in the write-once memory. The limited storage capacity of the write-once memory device is thereby used efficiently.

Similarly, an acquisition/playback device itself can review the digital file stored in the re-writable memory and determine whether to commit that file to the write-once memory or to discard the file from the re-writable memory.

The foregoing discussion has been intended by way of general introduction, and should not be used to narrow the scope of the following claims.

DETAILED DESCRIPTION OF THE PRESENTLY PREFERRED EMBODIMENTS

Figure 1:
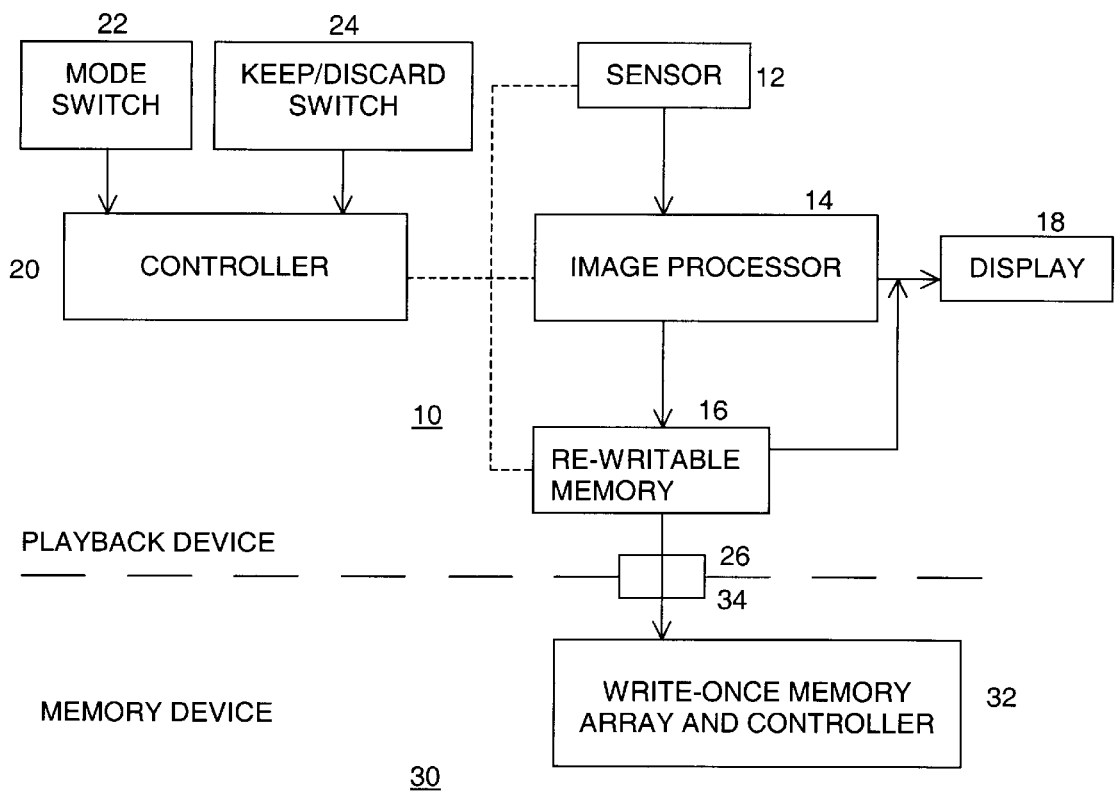
FIG. 1 is a block diagram of a acquisition/playback device and a memory device suitable for use in the method of FIG. 2.

Turning now to the drawings, FIG. 1 shows a block diagram of a acquisition/playback device 10 that is releasably connected to a memory device 30.

In this example, the acquisition/playback device 10 takes the form of a digital camera, and the acquisition/playback device 10 includes a sensor 12 such as a conventional CMOS or CCD sensor for sensing an image. The sensor 12 applies the sensed image information to an image processor 14 that in turn generates a digital file that is initially stored in a re-writable memory 16. The memory 16 can take any suitable form. For example, in one embodiment the re-writable memory 16 is embodied as a random access memory. In other embodiments magnetic storage media are used to implement the re-writable memory 16.

The image processor 14 and the re-writable memory 16 are coupled with a display 18 that may for example be a liquid crystal display. Digital files stored in the re-writable memory 16 can be presented on the display 18 for user review. The re-writable memory 16 and the image processor 14 are also coupled with an electrical connector 26, via which the stored digital file can be exported to the memory device 30.

The sensor 12, image processor 14, and re-writable memory 16 are under the control of a controller 20. The controller 20 receives a number of user commands, including commands from the switches 22, 24. The switch 22 allows a user to select the mode of operation of the acquisition/playback device 10, as described below in conjunction with FIG. 2. The switch 24 is controlled by a user to selectively store digital files in the write-once memory device 30, also as explained in greater detail below.

The write-once memory device 30 includes a write-once memory array 32 and associated controller, which are coupled with an electrical connector 34 configured to mate with the connector 26 of the acquisition/playback device 10. Note that the controller on the write-once memory device is not required. For example, the controller may be included in the device 10.

The write-once memory array can take many forms, but in all cases it is a solid-state array in which electrical signals are applied to the array to cause digital information to be stored in the array and read from the array. A controller on the write-once memory array may or may not be present. On occasion, the memory array 32 will be referenced as a solid-state memory array. This term is meant to include a wide variety of memory arrays that respond to electrical read and write signals.

By way of example, the memory array 32 may be constructed as described in U.S. Pat. No. 6,034,882, assigned to the assignee of the present invention and hereby incorporated by reference. Other preferred aspects of the memory device 30 are described in the following U.S. patent applications, all of which are hereby incorporated by reference, and all of which are assigned to the assignee of the present invention: U.S. patent applications Ser. Nos. 09/638,428, 09/638,439, 09/638,427, 09/638,334, and 09/662,953.

In this example, the memory device 30 is a modular, portable unit that is readily connected to the acquisition/playback device 10 and disconnected from the acquisition/playback device 10 by means of the electrical connectors 26, 34. The memory device 30 for example can take the form of a memory card, and it conventionally includes a housing such as a plastic or metal housing that encloses the memory array 32 and mounts the connector 34 in an exposed portion of the memory device 30. See the detailed descriptions of the above-identified patent applications for further details.

The acquisition/playback device 10 is not limited to a digital camera, and in alternative embodiments the acquisition/playback device 10 can be a device for recording voice or music, or a device for recording video information. As another example, the acquisition/playback device can include a sensor for recording handwritten text. The device may also include a tester or some other industrial acquisition device. The acquired digital information is not in all cases measured by a sensor incorporated in the acquisition/playback device 10. In some embodiments the acquired digital information is received from an external source. For example, the acquired digital information may be downloaded from a network such as the Internet.

Figure 2:
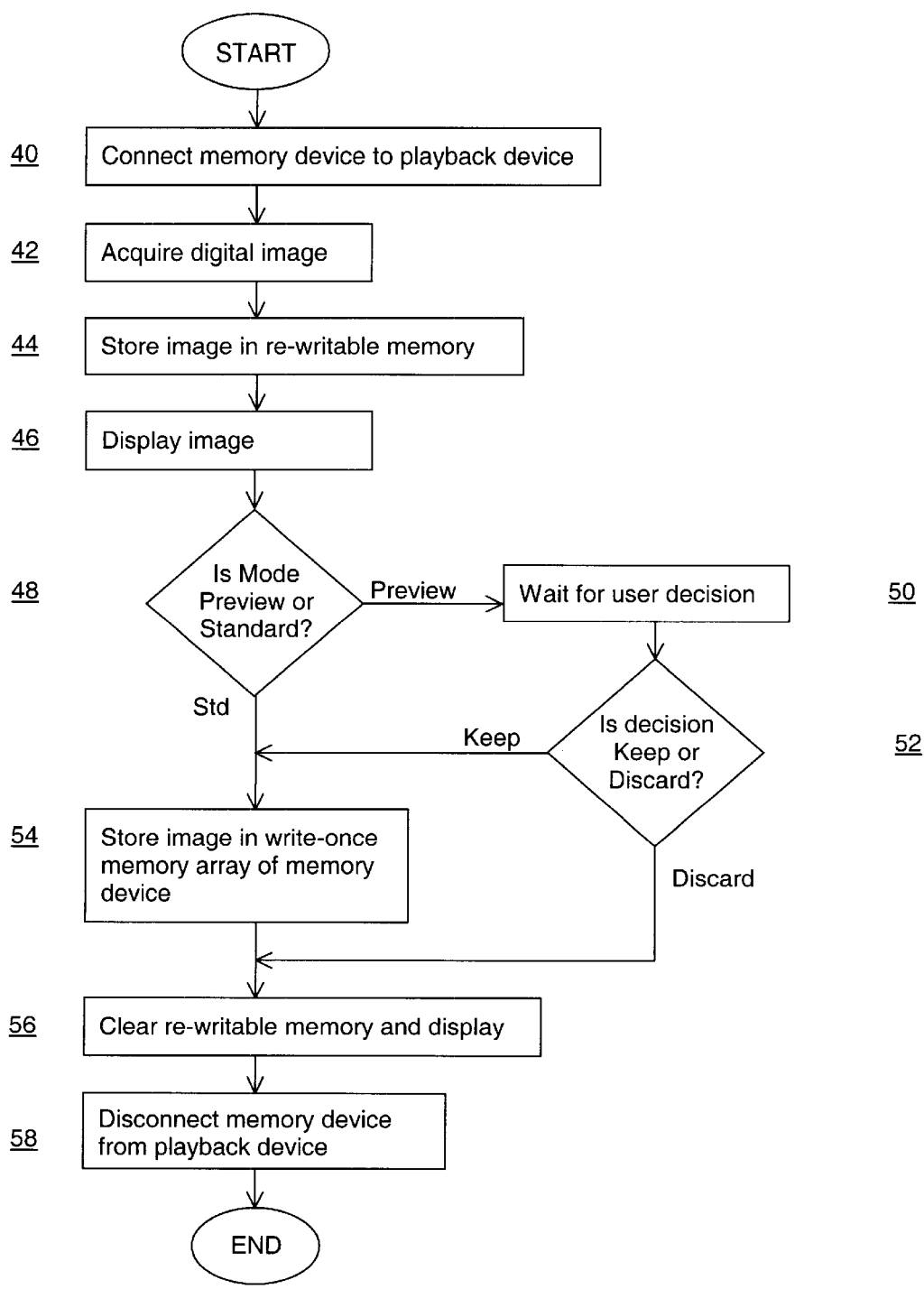
FIG. 2 is a flow chart of a method implemented by the elements of FIG. 1.

FIG. 2 shows one method implemented by the system of FIG. 1. As shown at block 40, first the memory device is connected to the acquisition/playback device. In the example described above, this is done simply by plugging the memory device into the acquisition/playback device, mating the respective connectors. Next, in block 42 digital information such as a digital image is acquired. This can correspond to the user taking a picture or making a recording of voice or music with a microphone. Alternatively, the digital information may be acquired by downloading it from another source.

Next, in block 44 the digital information (image in this example) is stored in the re-writable memory, and in block 46 this information is displayed for the user. Control then branches in block 48, depending upon whether the mode switch 22 is in the Preview state or the Standard state.

If the Preview mode as been selected, the system waits for a user decision in block 50, namely user control of the Keep/Discard switch 24 (block 52). If the user decision is to keep the displayed image (i.e., the user issues a first command), control is transferred to block 54, where the image is stored in the write-once memory array of the memory device. Alternatively, if the user decision is to discard the displayed image (i.e., the user issues a second command), control is passed to block 56, thereby preventing the file corresponding to the displayed image from being stored in the write-once memory array.

In the event the mode selection switch has been used to select the Standard mode of operation, control passes directly from block 48 to block 54, and the file corresponding to the displayed image is stored in the write-once memory array, regardless of the state of the Keep/Discard switch 24.

After block 54, control is transferred to block 56, where the re-writable memory and the display are cleared. At this point, the user can then disconnect the memory device from the acquisition/playback device in block 56, thereby completing the method. Of course, the memory device may be left connected with the acquisition/playback device if additional digital files are to be reviewed and possibly stored in the write-once memory device.

It should be apparent from the foregoing description that the method of FIG. 2 allows a user to screen digital files prior to storing them in the write-once memory array. In the event the user is dissatisfied with a displayed or otherwise presented digital file, that file can simply be cleared from re-writable memory, without ever storing it in the write-once memory array. In this way, the limited storage capacity of the write-once memory array is preserved for digital files that have been selected by the user as of sufficient interest to warrant long-term storage.

The method of FIG. 2 may be modified to allow a user to store a partial file, e.g., a part of a song or a part of an image, in the write-once memory array. This method is well-suited for use with digital media files such as files storing speech, music, images, or video, though other types of digital files can also be used.

Of course, many alternatives are possible to the preferred system and method described above. As mentioned above, this method can be applied to any digital information, including digital information encoding music, voice, video, still images, and the like. It can be used with digital information that is either sensed by the acquisition/playback device or received by the acquisition/playback device from another source. The system may also involve an industrial application such as a tester. After storing the digital information to the re-writable memory, such a device would be capable of reviewing the digital information, and with no direct human interaction but based upon pre-programmed criteria, would make the decision to either discard the digital information or store it to the write-once memory.

The memory device preferably includes a three-dimensional memory array, in view of the low manufacturing costs that can be achieved with this technology. However, the methods described above are also useful with solid-state memory arrays of the conventional, two-dimensional type.

As used herein the term "solid-state memory array" refers to an array that responds to electrical write signals and produces electrical read signals, and the term does not encompass optical memory devices such as CD ROMs.

The term "array" is intended broadly to encompass both two and three-dimensional arrays of memory cells, unless otherwise indicated.

The term "playback" is intended broadly to encompass both visual playback via a suitable display and audio playback via a suitable speaker.

The term "media" is intended broadly to encompass speech, music, images and video.

The term "command" is intended broadly to encompass an action or the absence of an action. Thus, a user command may include a failure to make a selection within a predetermined time period.

The term "file" is intended broadly to cover all or part of a digital file. For example, a file can include data defining all or part of a song, image or the like.

The term "information" is intended broadly to cover any type of digital data recorded or read by an acquisition/playback device.

The foregoing detailed description has discussed only a few of the many forms that this invention can take. For this reason, this detailed description is intended by way of illustration, and not limitation. It is only the following claims, including all equivalents, that are intended to define the scope of this invention.

What is claimed is:

1. An acquisition/playback device comprising:
   a re-writable digital memory;
   a mode selection switch controllable by a user to select a first mode of operation or a second mode of operation;
   a controller in communication with the mode selection switch;
   wherein, in response to the first mode of operation being selected, the controller:

(a) stores digital information acquired by the acquisition/playback device in the re-writable digital memory as a stored digital file;
(b) presents at least part of the stored digital file for user review; and
(c) performs one of the two following acts:
  (1) in response to a first user command, selectively stores at least part of the stored digital file in a solid-state, write-once memory array of a modular, portable memory device coupled with the acquisition/playback device;
  (2) in response to a second user command, clears the stored digital file from the re-writable digital memory without storing any part of the stored digital file in a solid-state, write-once memory array of a modular, portable memory device coupled with the acquisition/playback device; and wherein, in response to the second mode of operation being selected, the controller stores digital information acquired by the acquisition/playback device in a solid-state, write-once memory array of a modular, portable memory device coupled with the acquisition/playback device without receiving an additional user command.

2. The device of claim 1 wherein the memory device comprises a memory card.

3. The device of claim 1 wherein the acquisition/playback device comprises a digital camera, and wherein the digital information encodes at least one image.

4. The device of claim 1 wherein the acquisition/playback device comprises a sensor.

* * * * *

UNITED STATES PATENT AND TRADEMARK OFFICE
CERTIFICATE OF CORRECTION

PATENT NO. : 6,584,541 B2
DATED : June 24, 2003
INVENTOR(S) : David R. Friedman et al.

It is certified that error appears in the above-identified patent and that said Letters Patent is hereby corrected as shown below:

Title page, item [54] and Column 1, line 2,
In the title, after "INFORMATION" delete "IN WRITE-ONCE" and substitute
-- FIRST IN A RE-WRITABLE DIGITAL MEMORY AND THEN IN A WRITE-ONCE -- in its place.

Signed and Sealed this

Twenty-seventh Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,584,541 B2
DATED : June 24, 2003
INVENTOR(S) : David R. Friedman et al.

It is certified that error appears in the above-identified patent and that said Letters Patent is hereby corrected as shown below:

<u>Title page, Item [54] and Column 1, line 2,</u>
Title, after "INFORMATION" delete "IN WRITE-ONCE" and substitute -- FIRST IN A RE-WRITABLE DIGITAL MEMORY AND THEN IN A WRITE-ONCE -- in its place.

Signed and Sealed this

Fifteenth Day of June, 2004

JON W. DUDAS
*Acting Director of the United States Patent and Trademark Office*